United States Patent
Obata et al.

(10) Patent No.: US 9,287,887 B2
(45) Date of Patent: Mar. 15, 2016

(54) DEM CIRCUIT, DELTA-SIGMA MODULATOR, D/A CONVERTER, AND WIRELESS COMMUNICATION DEVICE

(71) Applicant: PANASONIC CORPORATION, Osaka (JP)

(72) Inventors: Koji Obata, Osaka (JP); Kazuo Matsukawa, Osaka (JP); Yosuke Mitani, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 125 days.

(21) Appl. No.: 14/309,325

(22) Filed: Jun. 19, 2014

(65) Prior Publication Data

US 2014/0301253 A1    Oct. 9, 2014

Related U.S. Application Data

(63) Continuation of application No. PCT/JP2012/008173, filed on Dec. 20, 2012.

(30) Foreign Application Priority Data

Dec. 28, 2011    (JP) ................. 2011-289460

(51) Int. Cl.
| | |
|---|---|
| H03M 1/06 | (2006.01) |
| H03M 1/66 | (2006.01) |
| H04L 5/14 | (2006.01) |
| H03M 1/74 | (2006.01) |
| H03M 3/00 | (2006.01) |

(52) U.S. Cl.
CPC .......... *H03M 1/0614* (2013.01); *H03M 1/0665* (2013.01); *H03M 1/66* (2013.01); *H03M 3/368* (2013.01); *H04L 5/1461* (2013.01); *H03M 1/74* (2013.01); *H03M 3/464* (2013.01); *H03M 3/50* (2013.01)

(58) Field of Classification Search
None
See application file for complete search history.

(56) References Cited

U.S. PATENT DOCUMENTS 6,522,277 B2 * 2/2003 Fujimori ............. H03M 1/0665
341/118
2002/0105453 A1 8/2002 Fujimori et al.

FOREIGN PATENT DOCUMENTS

JP    2007-158735 A    6/2007

OTHER PUBLICATIONS

Norsworthy, Steven R., et al.: "Delta-Sigma Data Converters, Theory, Design, and Simulation", IEEE Press, Wiley-Interscience, 1997, pp. 1-6.

(Continued)

*Primary Examiner* — Adnan Baig
(74) *Attorney, Agent, or Firm* — McDermott Will & Emery LLP

(57) ABSTRACT

DEM circuit (130) includes a switch (131) configured to receive an N-bit digital input signal (SD1) and shift bit positions of the digital input signal (SD1) based on a switch control signal (SC) in a circulating pattern to output the digital input signal (SD1) as an N-bit digital output signal (SD2), where N is an integer greater than or equal to 2, and a switch control signal generation circuit (132) including a plurality of pointers which move in an identical direction based on a predetermined rule, and configured to generate the switch control signal (SC), each time when the digital input signal (SD1) is input to the switch (131), by using the pointers in a predetermined order.

11 Claims, 14 Drawing Sheets

(56) References Cited

OTHER PUBLICATIONS

Inose, Hiroshi, et al.: "A Unity Bit Coding Method by Negative Feedback", Proceedings of the IEEE, Nov. 1963, vol. 51, pp. 1524-1535.

Geerts, Yves, et al.: "Design of Multi-Bit Delta-Sigma A/D Converters", Kluwer Academic Publishers, May 2002, pp. 74-97.

Matsukawa, Kazuo, et al.: "A 69.8 dB SNDR 3rd-order Continuous Time Delta-Sigma Modulator with an Ultimate Low Power Tuning System for a Worldwide Digital TV-Receiver", Custom Integrated Circuits, IEEE, 2010, 4 pages.

International Search Report issued in PCT/JP2012/008173, dated Jan. 29, 2013, with English translation.

* cited by examiner

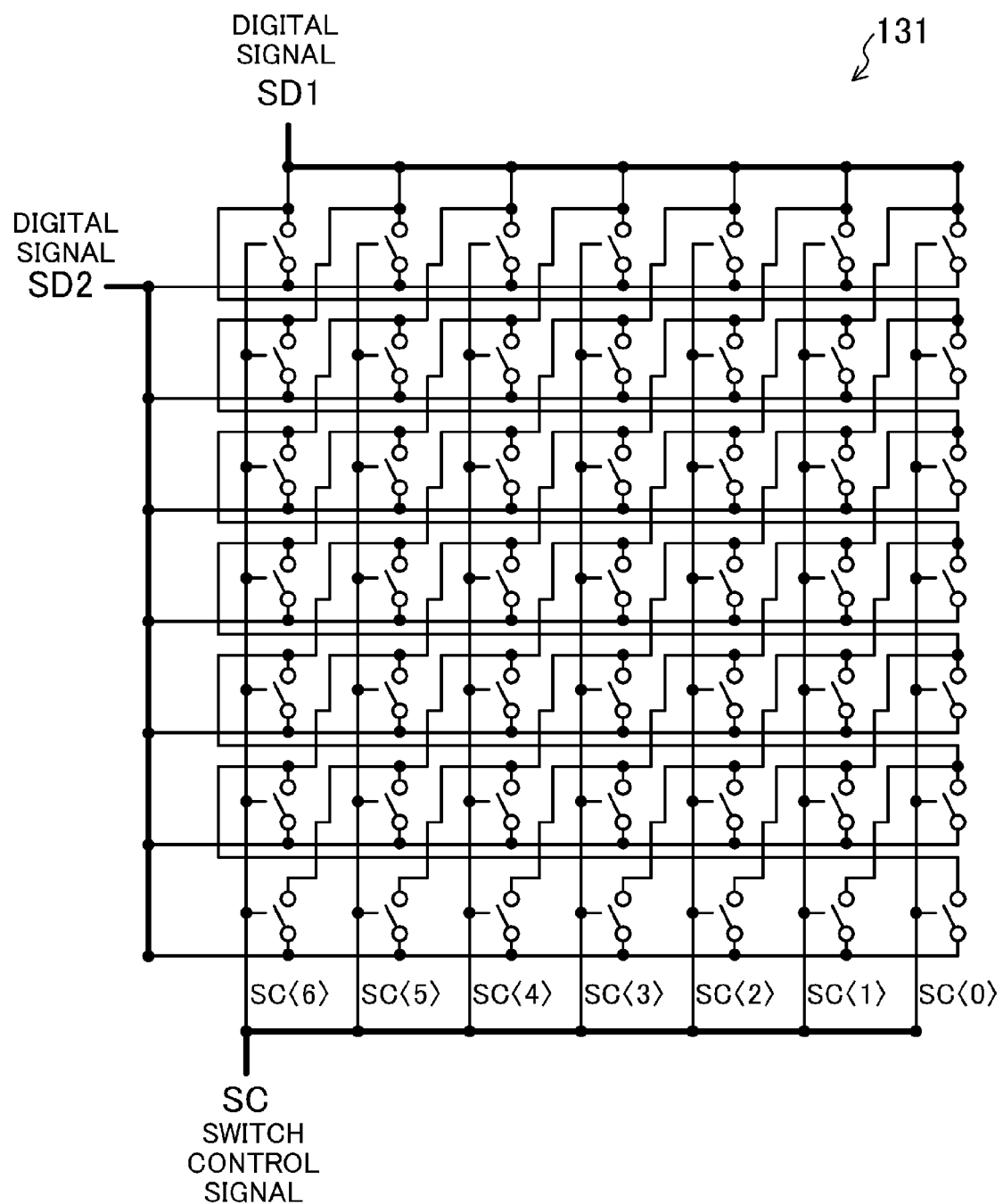

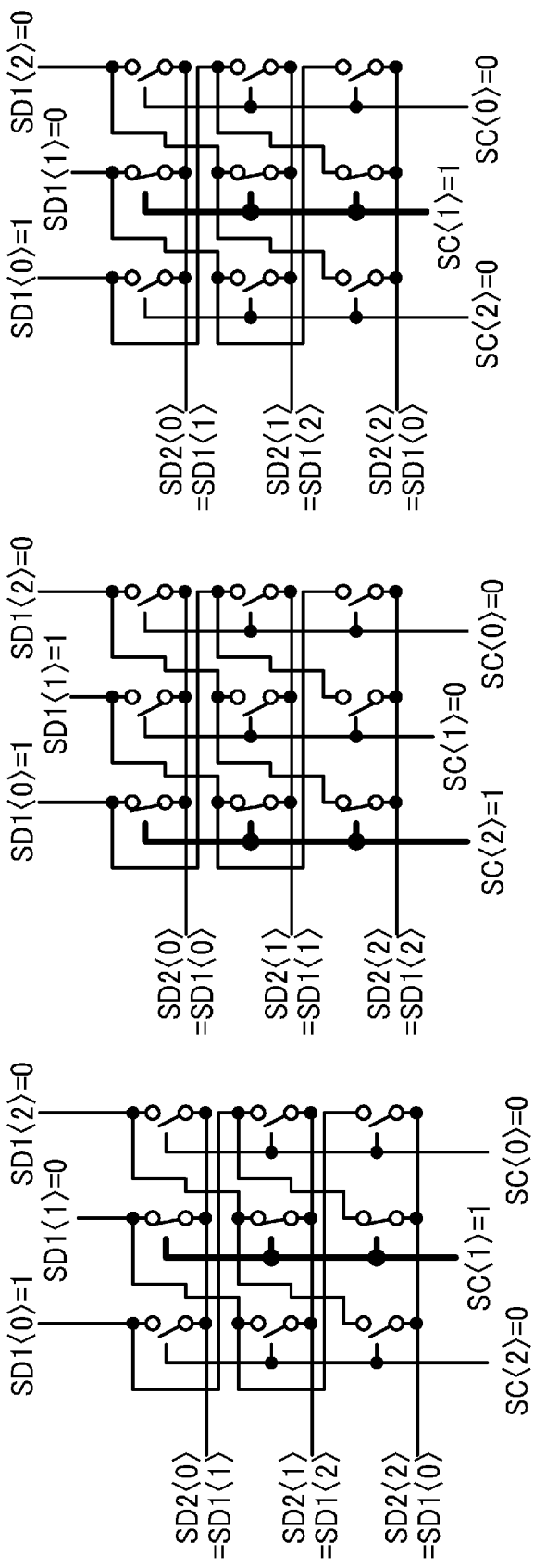

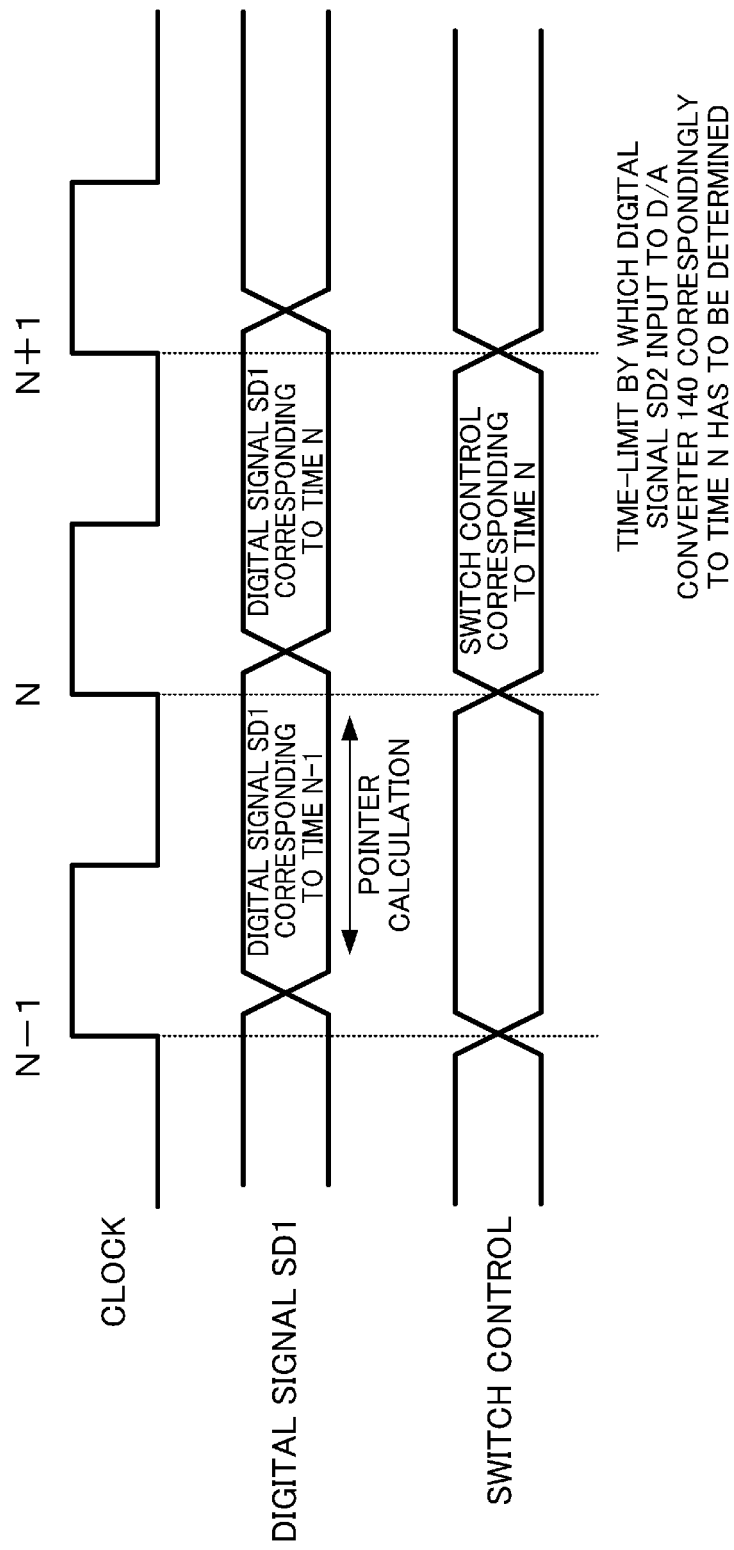

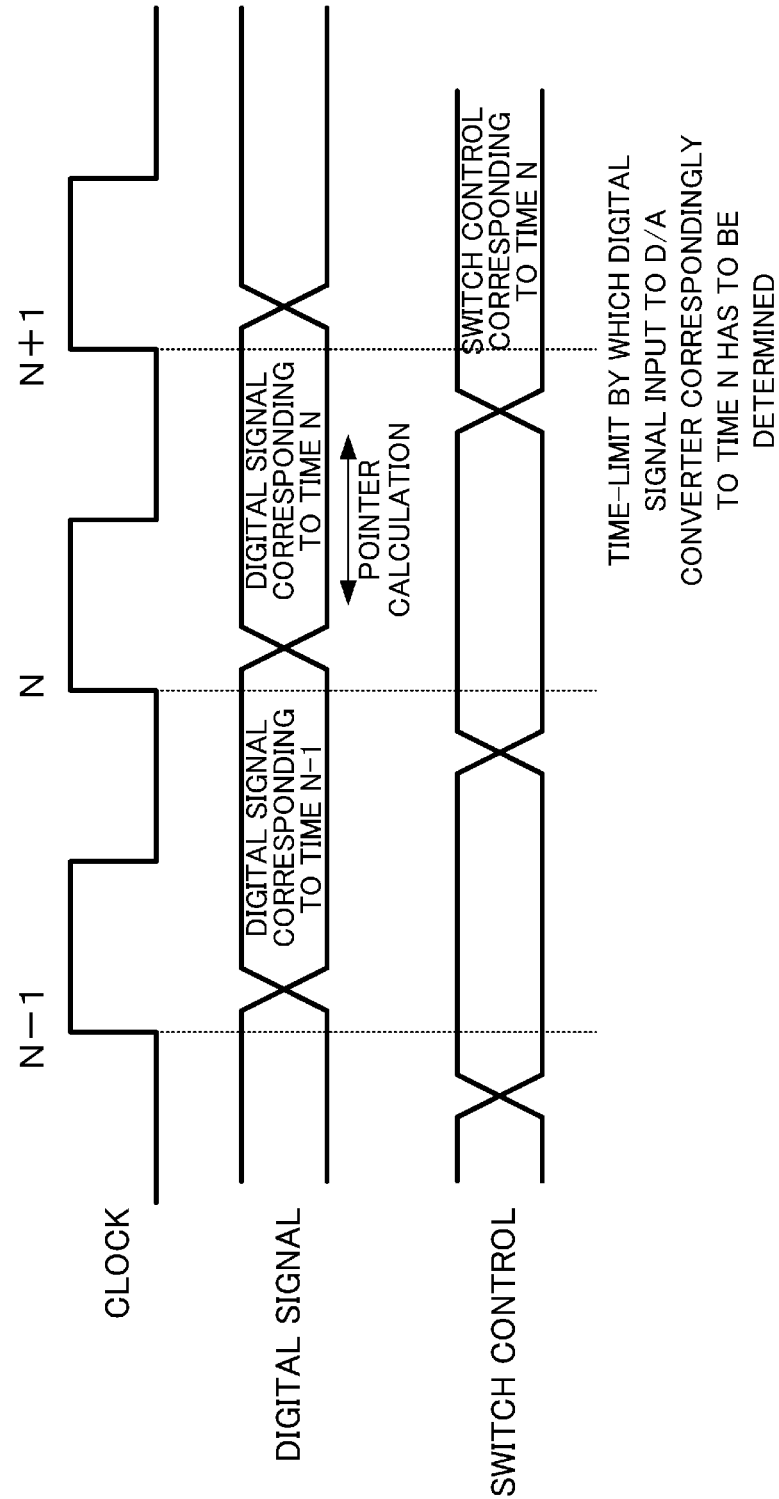

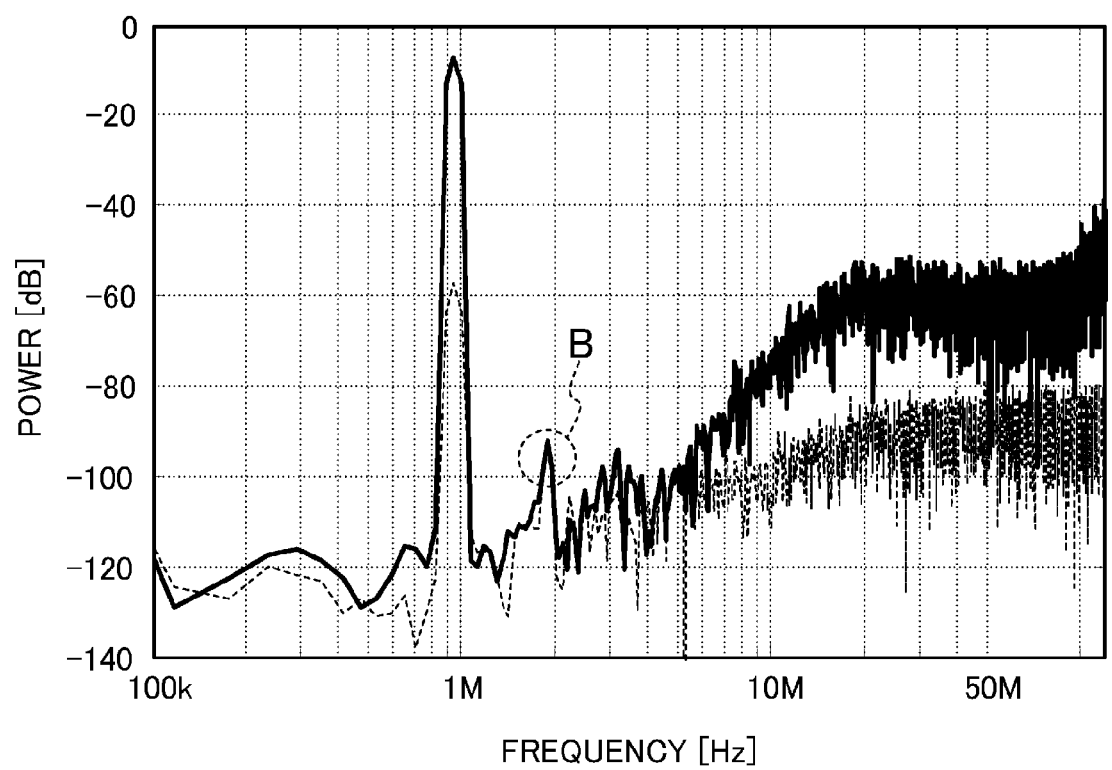

DEM CIRCUIT, DELTA-SIGMA MODULATOR, D/A CONVERTER, AND WIRELESS COMMUNICATION DEVICE

CROSS-REFERENCE TO RELATED APPLICATIONS

This is a continuation of International Application No. PCT/JP2012/008173 filed on Dec. 20, 2012, which claims priority to Japanese Patent Application No. 2011-289460 filed on Dec. 28, 2011. The entire disclosures of these applications are incorporated by reference herein.

BACKGROUND

The present disclosure relates to dynamic element matching (DEM) circuits used for, for example, delta-sigma modulators, and specifically to techniques for reducing harmonic distortion of DEM circuits.

In general, delta-sigma modulators used in analog-to-digital (A/D) converters have higher accuracy than Nyquist A/D converters due to noise shaping techniques and oversampling techniques of the delta-sigma modulators, and thus the delta-sigma modulators are known as methods by which power consumption can be reduced. Among the delta-sigma modulators, a continuous-time delta-sigma modulator is known as a technique suitable for high-speed and broadband delta-sigma modulators. In a general continuous-time delta-sigma modulator, an input signal passes through a loop filter including a plurality of analog integrators which are cascade-connected and is then quantized by a quantizer. An output of the quantizer is fed back to a loop filter by a feedback digital-to-analog (D/A) converter as an analog signal (see, for example, Steven R. Norsworthy, Richard Schreier and Gabor C. Terms, "Delta-Sigma Data Converters Theory, Design and Simulation", (USA), Wiley-IEEE Press, 1997, p. 1-6, H. Inose, Y. Yasuda, "A unity bit coding method by negative feedback", (USA), Proceedings of the IEEE, November 1963, Vol. 51 p. 1524-1535).

In general, in order to improve the conversion accuracy of a delta-sigma modulator, a multi-bit quantizer has to be used. However, when a multi-bit quantizer is used, harmonic distortion occurs due to mismatch between elements of a feedback D/A converter. Therefore, in order to reduce the harmonic distortion, a dynamic element matching (DEM) circuit is used (see, for example, Y. Geerts, M. Steyaert, W. Sansen, "Design of Multi-bit Delta-Sigma A/D Converters", (USA), Kluwer Academic Publishers, May 2002, p. 74-97).

When data weighted averaging (DWA) is used as an algorithm of a DEM circuit, new harmonic distortion occurs due to the property of the DWA, parasitic capacitance of the feedback D/A converter, and an input offset voltage of an operational amplifier in the loop filter (see, for example, Kazuo Matsukawa, and six other persons, "A 69.8 dB SNDR 3rd-order Continuous Time Delta-Sigma Modulator with an Ultimate Low Power Tuning System for a Worldwide Digital TV-Receiver", Custom Integrated Circuits Conference (CICC), 2010 IEEE (USA), 19-22 Sep. 2010, p. 1-4).

FIGS. 13A and 13B are views illustrating example operation of a general DEM circuit using DWA as an algorithm. FIGS. 13A and 13B illustrate an example of a 7-bit DEM circuit.

In FIG. 13A, time (TIME) elapses downward from above, digits (CODE) on the left in the figure represent output codes of the DEM circuit, and digits (# OF CHANGES) on the right in the figure represent the number of bits whose values ("0" and "1") have been changed between two output codes which are consecutive in time.

FIG. 13B is a view illustrating changes with time in the output codes (CODE) and changes with time in the number of bits whose values have been changed (# OF CHANGES). In FIG. 13B, the solid line represents changes with time in the output code, and the broken line represents changes with time in the number of bits whose values have been changed. In a period of time in which one cycle of change in the output code occurs, two cycles of change in the number of bits whose values have been changed occur. When a DEM circuit having such cyclicity is used in, for example, a delta-sigma modulator, second harmonics are generated due to parasitic capacitance of a D/A converter connected to the DEM circuit and an offset voltage of an operational amplifier included in a loop filter receiving an output of the D/A converter.

FIG. 14 shows an example of an output spectrum of a delta-sigma modulator when DWA is used. The thick solid line represents a digital output signal of the delta-sigma modulator after fast Fourier transform (FFT), and the thin broken line represents an output signal of a D/A converter included in the delta-sigma modulator after FFT. As illustrated in FIG. 14, second harmonics generated in the output signal of the D/A converter directly appears in the digital output signal of the delta-sigma modulator (C in FIG. 14).

To solve the problem, for example, U.S. Pat. No. 6,522,277 describes a DEM circuit in which two pointers are provided, and the two pointers are alternately moved in opposite directions, thereby reducing harmonic distortion including second harmonics.

SUMMARY

Oversampling techniques are used in delta-sigma modulators, which requires DEM circuits capable of operating at a speed higher than or equal to several tens of MHz to several hundreds of MHz in order to obtain broadband modulators.

However, the technique described in U.S. Pat. No. 6,522,277 is moving two pointers in opposite directions. Therefore, for example, when a switch such as a matrix switch is used to configure a DEM circuit, wires of the switch have to be dynamically changed, which increases the area of the DEM circuit. Even when a switch such as a matrix switch is not used, it takes time until pointer calculation is ended, so that the high-speed operation of the DEM circuit is difficult.

Therefore, it is an objective of the present disclosure to provide a DEM circuit which is capable of reducing harmonic distortion (second harmonics) and operating at a high speed, and has a small area.

A first aspect of the present disclosure provides a dynamic element matching (DEM) circuit including: a switch; and a switch control signal generation circuit, wherein the switch is configured to receive an N-bit digital input signal and shift bit positions of the digital input signal in a circulating pattern based on a switch control signal to obtain a shifted signal, and output the shifted signal as an N-bit digital output signal, where N is an integer greater than or equal to 2, the switch control signal generation circuit includes a plurality of pointers, the bit positions of the digital input signal in the digital output signal are determined by the pointers, the pointers move, based on a predetermined rule, in an identical direction which is any one of a direction toward higher bit orders or a direction toward lower bit orders, and the switch control signal generation circuit is configured to generate the switch control signal, each time when the digital input signal is input to the switch, by using the pointers in a predetermined order.

In the first aspect, the DEM circuit controls the switch by the switch control signal each time when the digital input signal is input to the switch, the switch control signal being generated with reference to a plurality of pointers which move in a predetermined order. Controlling the switch by using such pointers can reduce second harmonics compared to the case where control of the switch as in the present form is not performed. Moving the plurality of pointers in an identical direction allows the use of, for example, a matrix switch as the switch. Such a switch has a small circuit scale and is capable of operating at a high speed, and thus the speed of the DEM circuit can be increased.

A second aspect of the present disclosure provides a delta-sigma modulator including: a loop filter; a quantizer configured to receive a signal output from the loop filter and convert the signal to a digital signal; the DEM circuit described in the first form, and configured to receive the digital signal output from the quantizer as the digital input signal; and a feedback D/A converter configured to perform D/A conversion of a signal output from the DEM circuit to obtain an analog signal, and feedback the analog signal to an input of the loop filter.

A third aspect of the present disclosure provides a D/A converter including: the DEM circuit described in the first aspect; a current-type D/A converter configured to perform D/A conversion of a digital output signal of the DEM circuit, and a current-voltage converter including an operational amplifier configured to receive an output signal of the current-type D/A converter.

A fourth aspect of the present disclosure provides a wireless communication device including: an antenna configured to transmit/receive a radio wave; a receiver including the delta-sigma modulator described in the second form and configured to perform a reception process of a received signal from the antenna; a transmitter configured to perform a transmission process of a transmission signal; and a duplexer disposed between the receiver and the antenna and between the transmitter and the antenna, and configured to perform switching between supply of the received signal from the antenna to the receiver and supply of the transmission signal from the transmitter to the antenna.

According to the second to fourth forms, the DEM circuit configured to reduce second harmonics is used, and thus it is possible to provide a delta-sigma modulator, a D/A converter, and a wireless communication device which have reduced power consumption, are low cost, and have high accuracy while the circuit scale is reduced.

According to the present disclosure, a DEM circuit including a switch and having a reduced area can reduce second harmonics. The DEM circuit of the present disclosure can also operate at a high speed. Using the DEM circuit of the present disclosure in a delta-sigma modulator improves the performance of the delta-sigma modulator.

BRIEF DESCRIPTION OF THE DRAWINGS

FIG. 2 is a view illustrating an example configuration of a switch.

FIGS. 3A, 3B, and 3C are views illustrating example operation of the switch.

FIG. 6 is a view illustrating an example of a timing diagram of the DEM circuit according to the embodiment.

FIG. 7 is a view illustrating an example of a timing diagram of a conventional DEM circuit.

FIG. 9 is a view illustrating an example of an output spectrum of a delta-sigma modulator in which the another DEM circuit according to the embodiment is used.

DETAILED DESCRIPTION

Embodiments of the present disclosure will be described below with reference to the drawings.

Figure 1:
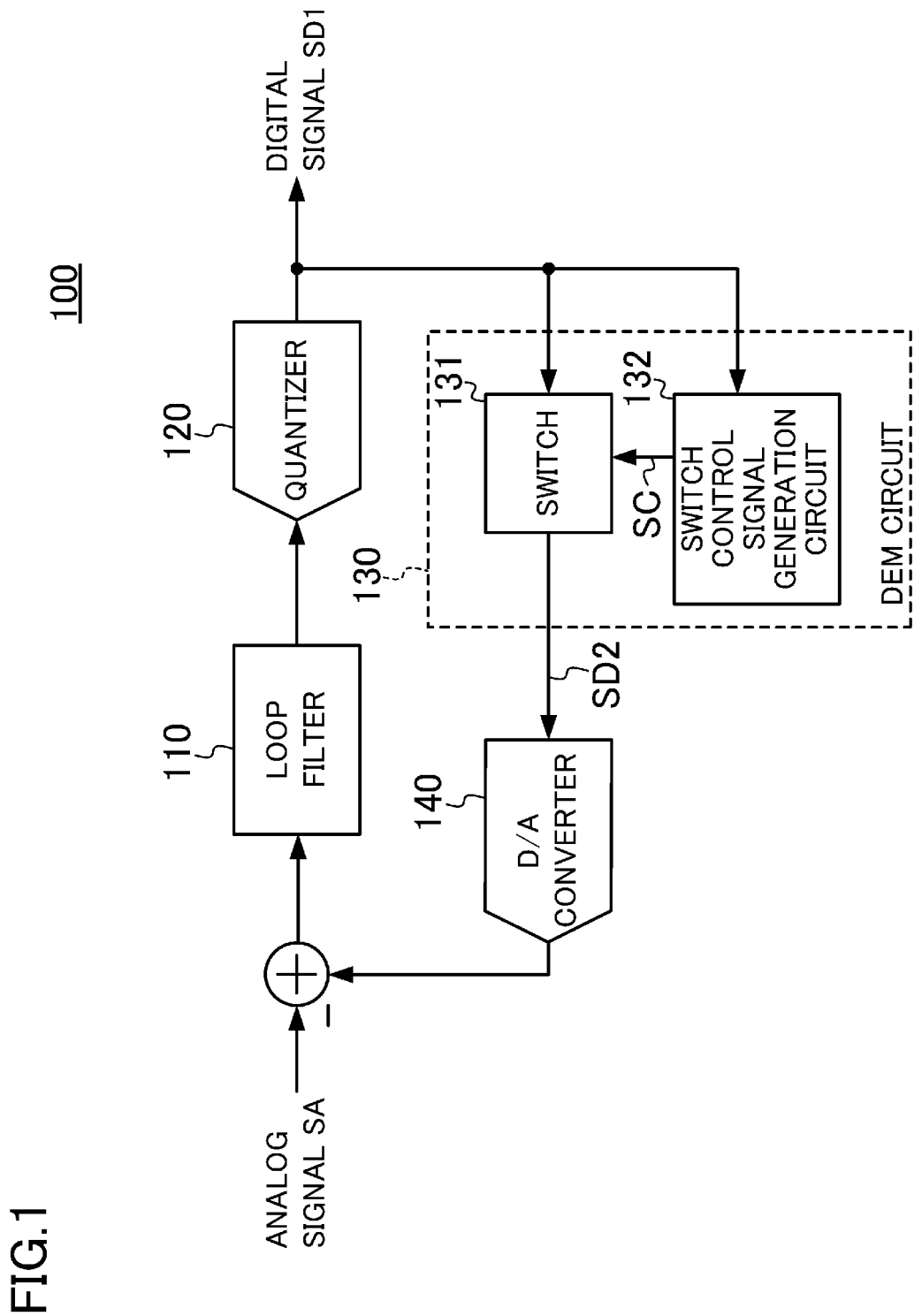
FIG. 1 is a view illustrating an example configuration of a delta-sigma modulator according to an embodiment.

FIG. 1 is a view illustrating an example configuration of a delta-sigma modulator according to an embodiment. A delta-sigma modulator 100 of FIG. 1 includes a loop filter 110, a quantizer 120, a DEM circuit 130, and a D/A converter 140 serving as a feedback D/A converter. The DEM circuit 130 includes a switch 131, and a switch control signal generation circuit 132.

Specifically, a signal representing a difference between an analog signal SA and an output signal of the D/A converter 140 is input to the loop filter 110. The quantizer 120 receives an analog signal output from the loop filter 110 to generate a digital signal SD1, and outputs the digital signal SD1. The digital signal SD1 passes through the DEM circuit 130, is D/A-converted by the D/A converter 140, and is fed back as an analog signal.

FIG. 2 is a view illustrating an example configuration of the switch. In FIG. 2, a 7-bit matrix switch is shown as an example of the switch 131. ON/OFF control of each of switches included in the switch 131 is performed by a switch control signal SC output from the switch control signal generation circuit 132. Specifically, switches connected to any one of signal lines of switch control signals SC<6>-SC<0> are turned on, whereas switches connected to the other signal lines are turned off, so that the digital signal SD1 passes through the switches which have been turned on, the bit positions of the digital signal SD1 are shifted (in a circulating pattern), and the digital signal SD1 is output as a digital signal SD2. Each of bits of the digital signal SD2 is output to a corresponding one of elements of the D/A converter 140 connected to the switch 131.

[Operation of Switch (Shift Operation of Bit Positions of Digital Signal)]

FIGS. 3A-3C are views illustrating example operation of the switch 131. FIGS. 3A-3C show an example of a 3-bit matrix switch. With reference to FIGS. 3A-3C, the example operation (shift operation of bit positions of a digital signal) of the switch 131 will be described in detail.

FIGS. 3A-3C show an example in which the digital signal SD1 changes from a state where SD1<2:0>=001 (FIG. 3A) to a state where SD1<2:0>=011 (FIG. 3B), and then to a state where SD1<2:0>=001 (FIG. 3C). Here, the switch control signal SC based on the digital signal SD1 changes from a state where SC<2:0>=010 (FIG. 3A) to a state where SC<2:0>=100 (FIG. 3B), and then to a state where SC<2:0>=010 (FIG. 3C).

Specifically, in FIG. 3A, the switch control signal SC is in a state where SC<2:0>=010. Therefore, switches connected to a signal line of a switch control signal SC<1> are turned on, and switches connected to signal lines of switch control signals SC<2> and SC<0> are turned off. At this time, a signal line of a digital signal SD1<2> is connected to a signal line of a digital signal SD2<1>, a signal line of a digital signal SD1<1> is connected to a signal line of a digital signal SD2<0>, and a signal line of a digital signal SD1<0> is connected to a signal line of a digital signal SD2<2>. Thus, the digital signal SD1 in a state where SD1<2:0>=001 is output as a digital signal SD2 in a state where SD2<2:0>=100. That is, the digital signal SD1 is output as the digital signal SD2 with the bit positions of the digital signal SD1 having been shifted (in a circulating pattern) toward lower bit orders by one bit.

Next, in FIG. 3B, the digital signal SD1 changes to a state where SD1<2:0>=011. At this time, a pointer which will be described later moves (in a circulating pattern) toward the lower bit orders by two which is equal to an output code input to the matrix switch as the digital signal SD1. A switch control signal SC generated by using this pointer is in a state where SC<2:0>=100. In this way, the signal line of the digital signal SD1<2> is connected to the signal line of the digital signal SD2<2>, the signal line of the digital signal SD1<1> is connected to the signal line of the digital signal SD2<1>, and the signal line of the digital signal SD1<0> is connected to the signal line of the digital signal SD2<0>. The digital signal SD1 in a state where SD1<2:0>=011 is output as a digital signal SD2 in a state where SD2<2:0>=011. That is, the digital signal SD1 is output as the digital signal SD2 without the bit positions of the digital signal SD1 being shifted.

Next, in FIG. 3C, the digital signal SD1 changes to a state where SD1<2:0>=001. At this time, the pointer which will be described later moves toward the lower bit orders by one which is equal to an output code input as the digital signal SD1. A switch control signal SC generated by using the pointer is in a state where SC<2:0>=010. In this way, the signal line of the digital signal SD1<2> is connected to the signal line of the digital signal SD2<1>, the signal line of the digital signal SD1<1> is connected to the signal line of the digital signal SD2<0>, and the signal line of the digital signal SD1<0> is connected to the signal line of the digital signal SD2<2>. The digital signal SD1 in a state where SD1<2:0>=001 is output as a digital signal SD2 in a state where SD2<2:0>=100. That is, the digital signal SD1 is output as the digital signal SD2 with the bit positions of the digital signal SD1 having been shifted toward lower bit orders by one bit.

[Operation of DEM Circuit (Movement of Pointer)]

Figures 4A, 4B:
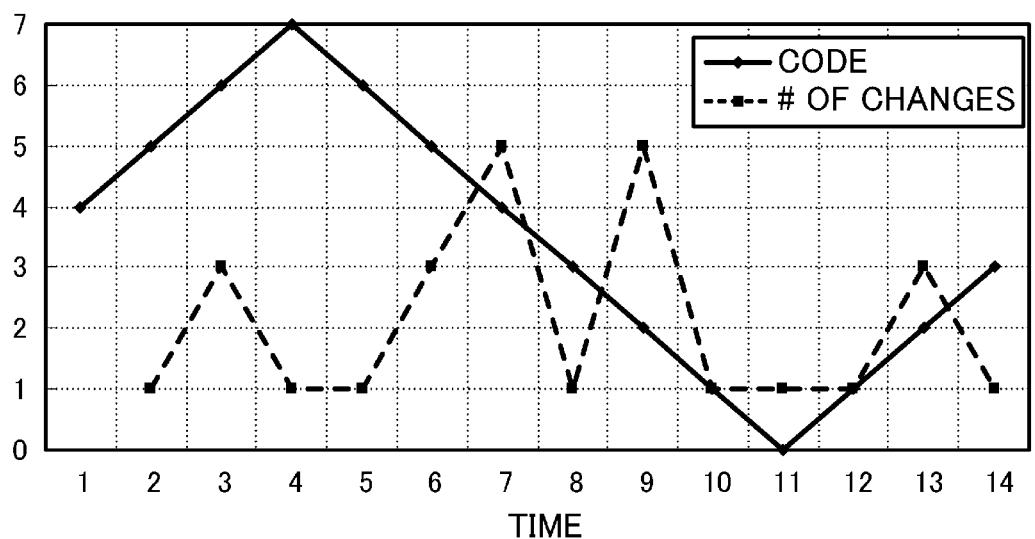
FIGS. 4A and 4B are views illustrating example operation of a DEM circuit according to the embodiment.

FIGS. 4A and 4B are views illustrating example operation of the DEM circuit 130 according to the present embodiment. FIGS. 4A and 4B show example movement of a pointer P1 serving as first pointer and a pointer P2 serving as a second pointer in the 7-bit DEM circuit 130. Note that the number of bits of the DEM circuit 130 is not limited to seven, but the number of bits may be greater or less than seven.

In FIG. 4A, time (TIME) elapses downward from above. Digits (CODE) on the left in the figure represent output codes CODE, which are input to the switch 131 as a 7-bit digital signal. The bit positions of the 7-bit digital signal are shifted based on the switch control signal SC, so that the 7-bit digital signal is output as the digital signal SD2. FIG. 4A shows the bit positions of the digital signal SD2 obtained by shifting the bit positions of the 7-bit digital signal, where reference symbols B6-B0 represent the bit positions of the bits. The digital signal SD2 is input to the D/A converter 140 such that each of the bit positions B6-B0 corresponds to an associated one of elements of the D/A converter 140. Digits (# OF CHANGES) on the right in the figure represent the number of bits whose values ("0" and "1") have been changed between two output codes CODE consecutive in time. Here, in FIG. 4A, the left-hand side of the figure is referred to as a higher bit order, and the right-hand side of the figure is referred to as a lower bit order. Note that the higher bit order and the lower bit order may be reversed.

Movement of the pointers P1, P2 included in the switch control signal generation circuit 132 will be described. Here, the pointers P1, P2 start from bit position B6 of the most significant bit. The pointers P1, P2 alternately move in a direction toward the lower bit orders (to the right) each time when the digital signal SD1 is input to the switch 131. Here, it is predetermined as a rule that each of the pointers P1, P2 moves by the number of bits which is equal to the output code CODE. That is, in FIG. 4A, hatching with slashes represents the output code CODE by which the pointer P1 moves, and hatching with backslashes represents the output code CODE by which the pointer P2 moves.

The start position and the way of movement of the pointers P1, P2 are not limited to this embodiment. For example, bit position B5 or bit position B3 other than bit position B6 may be the start position, or the start position of the pointer P1 may be shifted from the start position of the pointer P2. As long as the pointers P1, P2 move in an identical direction, the pointers P1, P2 may move in a direction toward the higher bit orders (to the left). Although it is predetermined as a rule that each pointer moves by the number of bits which is equal to the output code CODE, the disclosure is not limited to this embodiment. Each pointer may move by the number of bits which is two times the output code CODE.

The output code CODE changes in the order of "4"→"5"→"6"→"7" from above. The pointers P1, P2 alternately move, and for example, the pointer P1 moves when the output code CODE is "4" and when the output code CODE is "6," whereas the pointer P2 moves when the output code CODE is "5" and when the output code is "7." First, when the output code CODE is "4," the pointer P1 moves from bit position B6 by four to the right. That is, the pointer P1 moves to bit position B2. Next, when the output code CODE is "5," the pointer P2 moves from bit position B6 by five to the right. That is, the pointer P2 moves to bit position B1. In a similar manner, when the output code CODE is "6," the pointer P1 moves to bit position B3 (the pointers P1, P2 move in a circulating pattern), and when the output code CODE is "7," the pointer P2 moves to bit position B1. Sequentially, in a similar manner, in accordance with changes in the output code CODE, the pointers P1, P2 alternately move in an identical direction by the number of bits which is equal to the value of the output code CODE. The movement of the pointers P1, P2 can be realized by specifically, for example, using an adding circuit.

Each time when the output code CODE changes, the switch control signal generation circuit 132 generates a switch control signal SC by alternately using the positions of the pointers P1, P2. Specifically, the switch control signal generation circuit 132 generates a switch control signal SC which controls the shift amounts of bit positions B6-B0 such that bit position B6 of the digital signal SD1 is shifted to the positions of the pointers P1, P2 illustrated in FIG. 4A toward the lower bit orders. In the switch 131, switches connected to any one of the signal lines of the switch control signals SC<6>-SC<0> are turned on based on the switch control signal SC, thereby forming a short circuit. On the other hand, the switches connected to the other signal lines are turned off, that is, opened. In this way, the digital signal SD2 obtained by shifting the bit positions B6-B0 of the digital signal SD1 is input to the D/A converter 140 such that each of the bit positions B6-B0 corresponds to an associated one of elements of the D/A converter 140.

FIG. 4B is a view illustrating changes with time in the output code (CODE) of FIG. 4A and changes with time in the number of bits whose values have been changed (# OF CHANGES) of FIG. 4A. In FIG. 4B, the solid line represents changes with time in the output code CODE, and the broken line represents changes with time in the number of bits whose values have been changed. In a period of time in which one cycle of change in the output code CODE occurs, four cycles of change in the number of bits whose values have been changed occur, and the amplitude of the value is also reduced.

Figure 5:
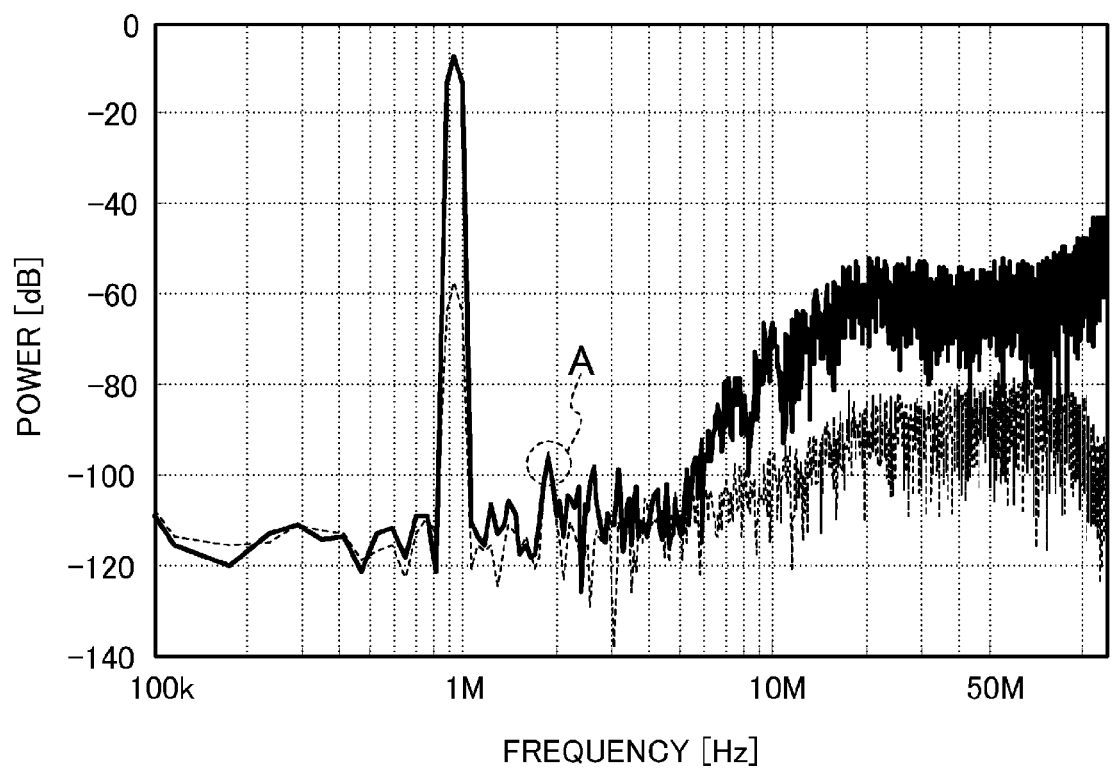
FIG. 5 is a view illustrating an example of an output spectrum of a delta-sigma modulator in which the DEM circuit according to the embodiment is used.
Figure 14:
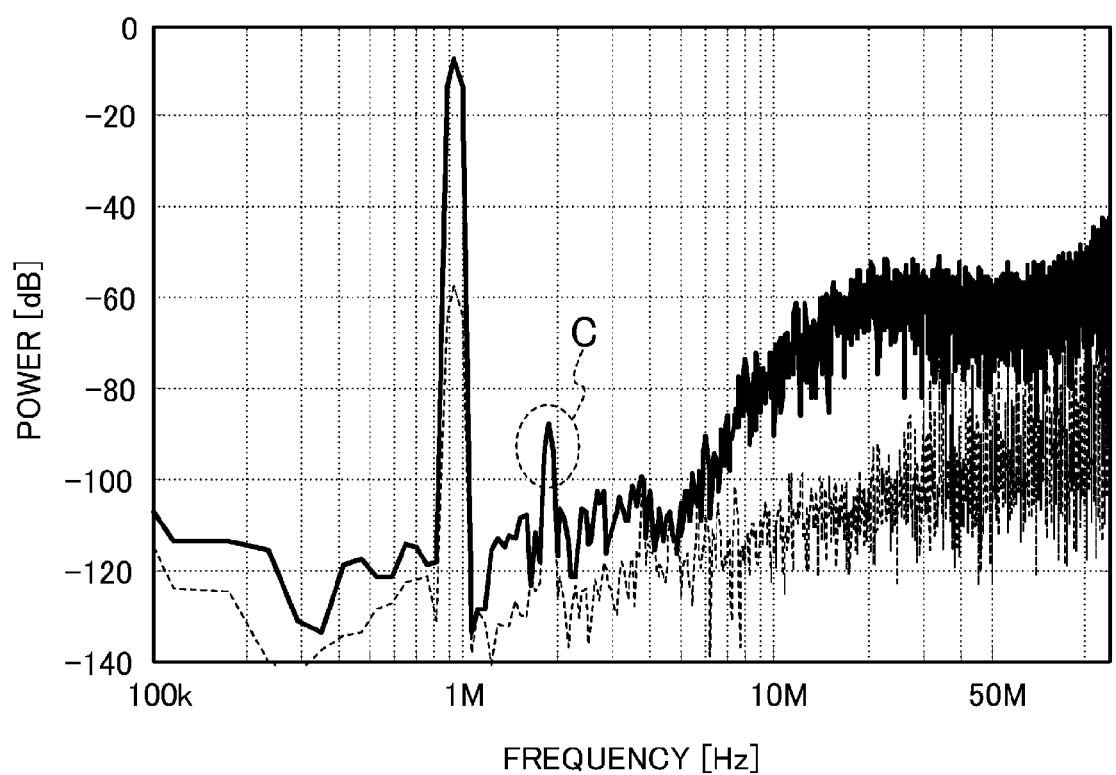
FIG. 14 is a view illustrating an example of an output spectrum of a delta-sigma modulator in which the conventional DEM circuit is used.

FIG. 5 is a view illustrating an example output spectrum of the delta-sigma modulator 100 in which the DEM circuit 130 according to the present embodiment is used. The thick solid line represents the digital signal SD1 after FFT, and the thin broken line represents the output signal of the D/A converter 140 after FFT. The second harmonic, which is at about −88 dB in FIG. 14, is reduced to −94 dB in FIG. 5 (A in FIG. 5).

FIG. 6 is a view illustrating an example timing diagram of the DEM circuit 130 according to the present embodiment.

First, at a rise of a clock at time N−1, a digital signal SD1 corresponding to time N−1 is output. Then, based on the digital signal SD1 corresponding to N−1, calculation of the pointer P1 or the pointer P2 corresponding to time N is performed.

Next, along with a rise of the clock at time N, a digital signal SD1 corresponding to time N is output. At this time, the calculation of the pointer P1 or the pointer P2 corresponding to time N has been ended, and thus a switch control signal SC corresponding to time N is output, thereby controlling switches of the switch 131, so that a digital signal SD2 corresponding to time N is output. Then, the digital signal SD2 is determined at time N+1 by the D/A converter 140.

In contrast, for example, in the case of using no matrix switch to reduce the increase in circuit scale (area) in an DEM circuit as described in, for example, U.S. Pat. No. 6,522,277, when computation of the pointer P1 or the pointer P2 is performed, the start time of the computation of the pointer P1 or the pointer P2 is delayed. For example, as illustrated in FIG. 7, the computation of the pointer corresponding to time N starts after the rise of the clock at time N.

When such a delay in start time occurs, outputting the switch control signal SC corresponding to time N is delayed. As a result, outputting the digital signal SD2 corresponding to time N is delayed. This delay reduces margins of time for determining the digital signal SD2 by the D/A converter 140 at time N+1. Thus, it becomes difficult to increase the speed of the DEM circuit 130 (to be higher than or equal to several tens of MHz to several hundreds of MHz).

As described above, in the present embodiment, the switch control signal generation circuit 132 controls the switch 131 by the switch control signal SC using pointers P1, P2 which alternately move in an identical direction, so that second harmonics can be reduced compared to the case where the pointers P1, P2 are not used. Moreover, a matrix switch is used as the switch 131, so that it is possible to increase the speed of the DEM circuit 130.

The pointers P1, P2 alternately move each time when the output code CODE changes, but the disclosure is not limited to this embodiment. For example, the pointers P1, P2 do not need to move each time when the output code CODE changes, but may move once every two changes of the output code CODE. The pointers P1, P2 do not need to move alternately. In the other examples of the operation of the DEM circuit (movement of the pointer) below, an example in which a randomly selected one of the pointers P1, P2 moves in an identical direction will be described.

(Other Examples of Operation of DEM Circuit (Movement of Pointer)

Figure 8A:
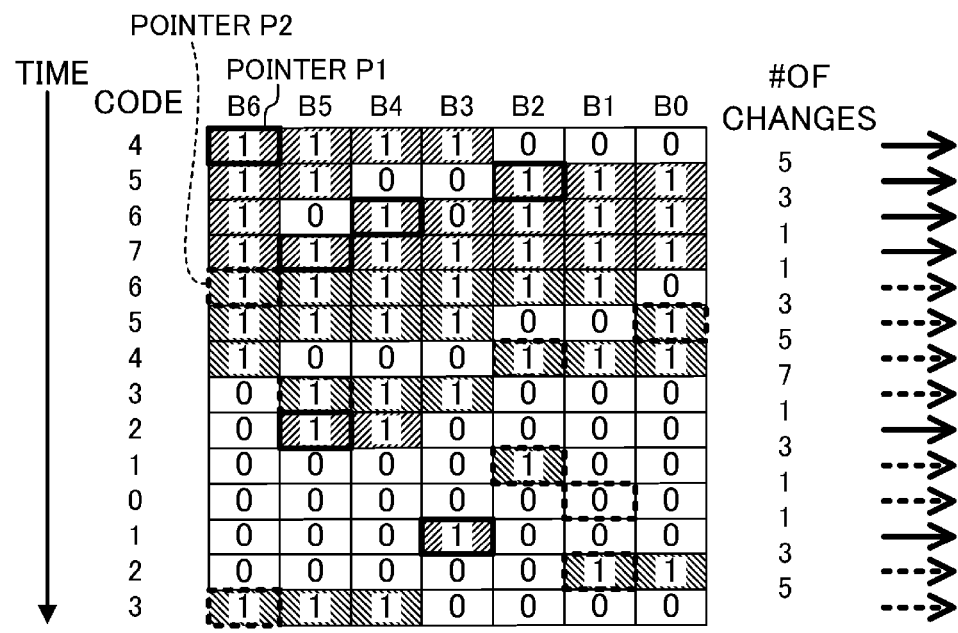
FIGS. 8A and 8B are views illustrating example operation of another DEM circuit according to the embodiment.
Figure 8B:
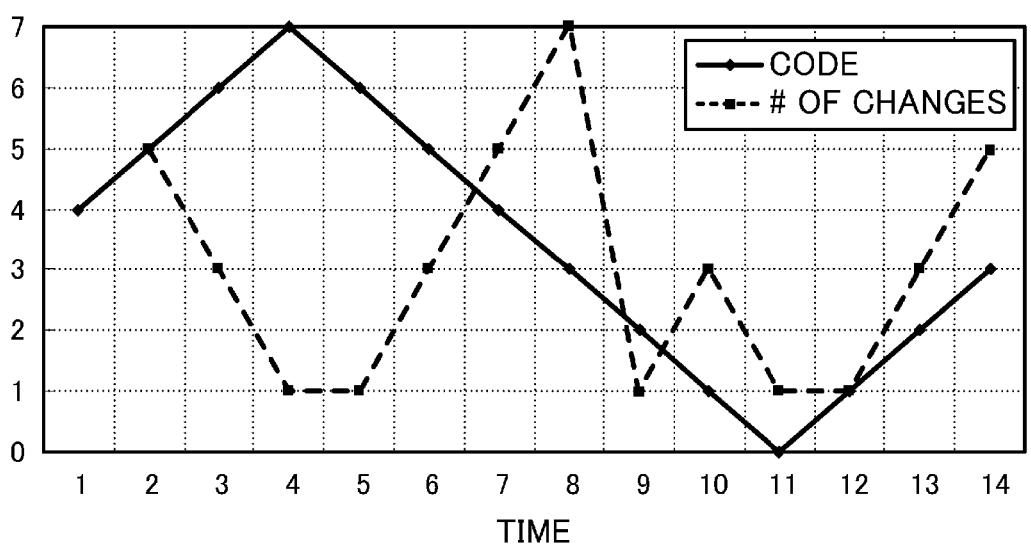

FIGS. 8A and 8B are views illustrating another example operation of the DEM circuit 130 according to the present embodiment. In FIGS. 8A and 8B, the same reference numerals as those shown in FIGS. 4A and 4B are used to represent equivalent elements, and the explanation thereof will be omitted. Similar to FIG. 4A and 4B, an example of a 7-bit DEM circuit 130 is shown in FIGS. 8A and 8B. However, the number of bits of the DEM circuit 130 may be greater than or less than seven.

In FIG. 8A, randomly selected one of the pointers P1, P2 moves. Specifically, while the output code CODE of the DEM circuit 130 changes in the order of "4"→"5"→"6"→"7" from above, the pointer P1 moves toward the lower bit orders (to the right). Then, while the output code CODE changes in the order of "6"→"5"→"4"→"3," the pointer P2 moves to the right. Thereafter, randomly selected one of the pointers P1, P2 moves in an identical direction, for example, when the output code CODE changes to "2," the pointer P1 moves, and when the output code CODE changes to "1," the pointer P2 moves.

FIG. 8B is a view illustrating changes with time in the output code (CODE) of FIG. 8A and changes with time in the number of bits whose values have been changed (# OF CHANGES) between two output codes CODE consecutive in time of FIG. 8A. In FIG. 8B, the solid line represents changes with time in the output code CODE, and the broken line represents changes with time in the number of bits whose values have been changed. In a period of time in which one cycle of change in the output code CODE occurs, two cycles of change in the number of bits whose value have been changed do not occur, and thus randomness is increased.

FIG. 9 is a view illustrating an example output spectrum of the delta-sigma modulator 100 in which the DEM circuit 130 of the present embodiment is used. Similar to FIG. 5, the solid line represents the digital signal SD1 after FFT, and the thin broken line represents the output signal of the D/A converter 140 after FFT. The second harmonic, which is about −88 dB in FIG. 14, is reduced to about −91.5 dB in FIG. 9 (B in FIG. 9). The noise floor is lower than that in FIG. 5.

As described above, second harmonics can be reduced also in the case where a randomly selected one of the pointers P1, P2 is moved in an identical direction.

In the random movement of the pointers P1, P2, whole or part of the digital signal SD1 output from the quantizer 120 may be used instead of a random number used for the random selection of the pointers P1, P2. In this case, it is no longer necessary to use a random number generation circuit.

In the embodiments, the number of pointers P1, P2 is not limited to two. For example, three or more pointers may be used. For example, when the number of pointers is three due to a pointer P3 added as a third pointer, it is predetermined as a common rule that the pointers P1, P2, P3 sequentially move in an identical direction which is one of a direction toward the higher bit orders or a direction toward the lower bit orders, or it is predetermined as a common rule that a randomly selected one of the pointers P1, P2, P3 moves in an identical direction which is one of a direction toward the higher bit orders or a direction toward the lower bit orders. Thus, harmonics are converted to a higher frequency, and harmonic power is also reduced. The predetermined common rule is not limited to that described above. For example, the pointers P1, P2, P3 may move in an identical direction according to a certain periodicity or regularly.

<First Example of Application of DEM Circuit>

Figure 10:
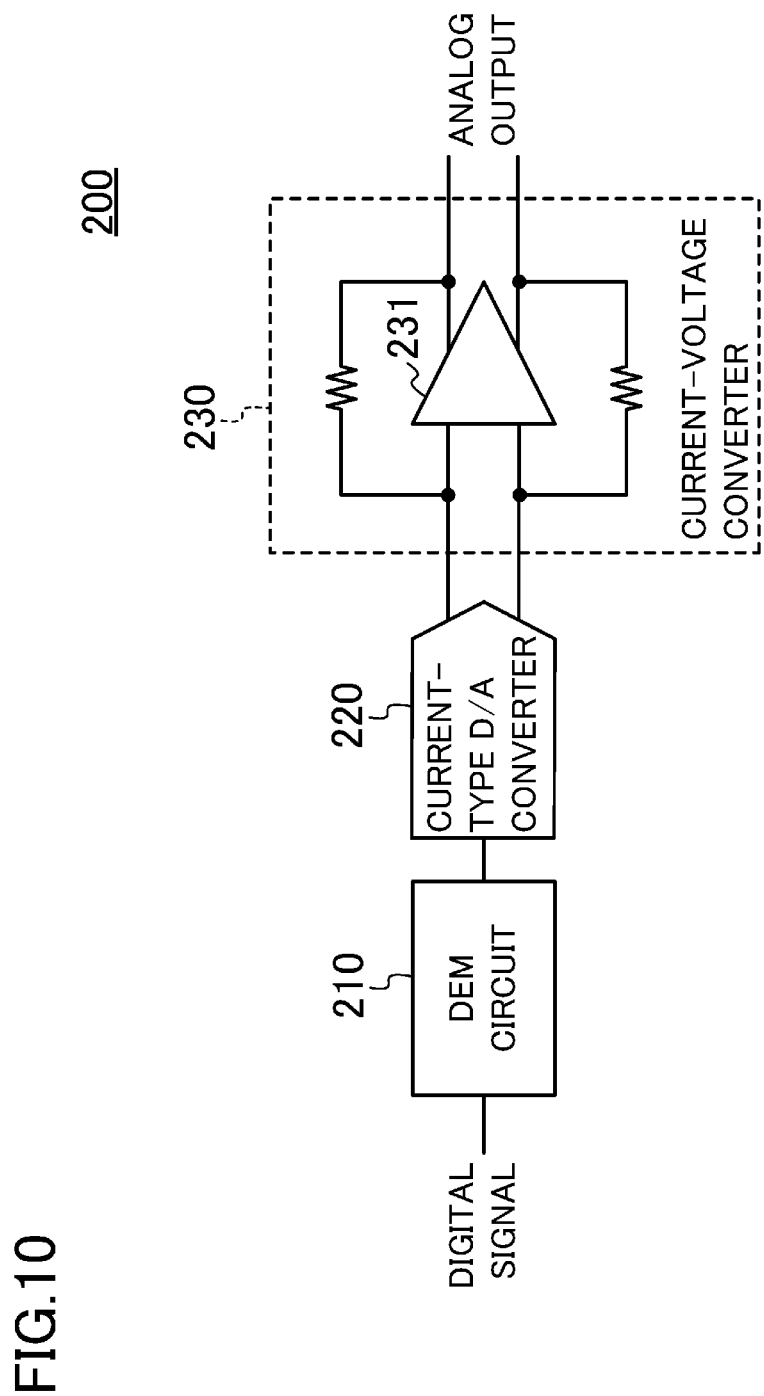
FIG. 10 is a block diagram illustrating an example configuration of a D/A converter.

FIG. 10 is a block diagram illustrating an example configuration of a D/A converter.

A D/A converter 200 of FIG. 10 includes a DEM circuit 210 as described in the above embodiment, a current-type D/A converter 220, and a current-voltage converter 230 including an operational amplifier 231. With this configuration, it is possible to reduce harmonic distortion also in the D/A converter 200.

Figure 11:
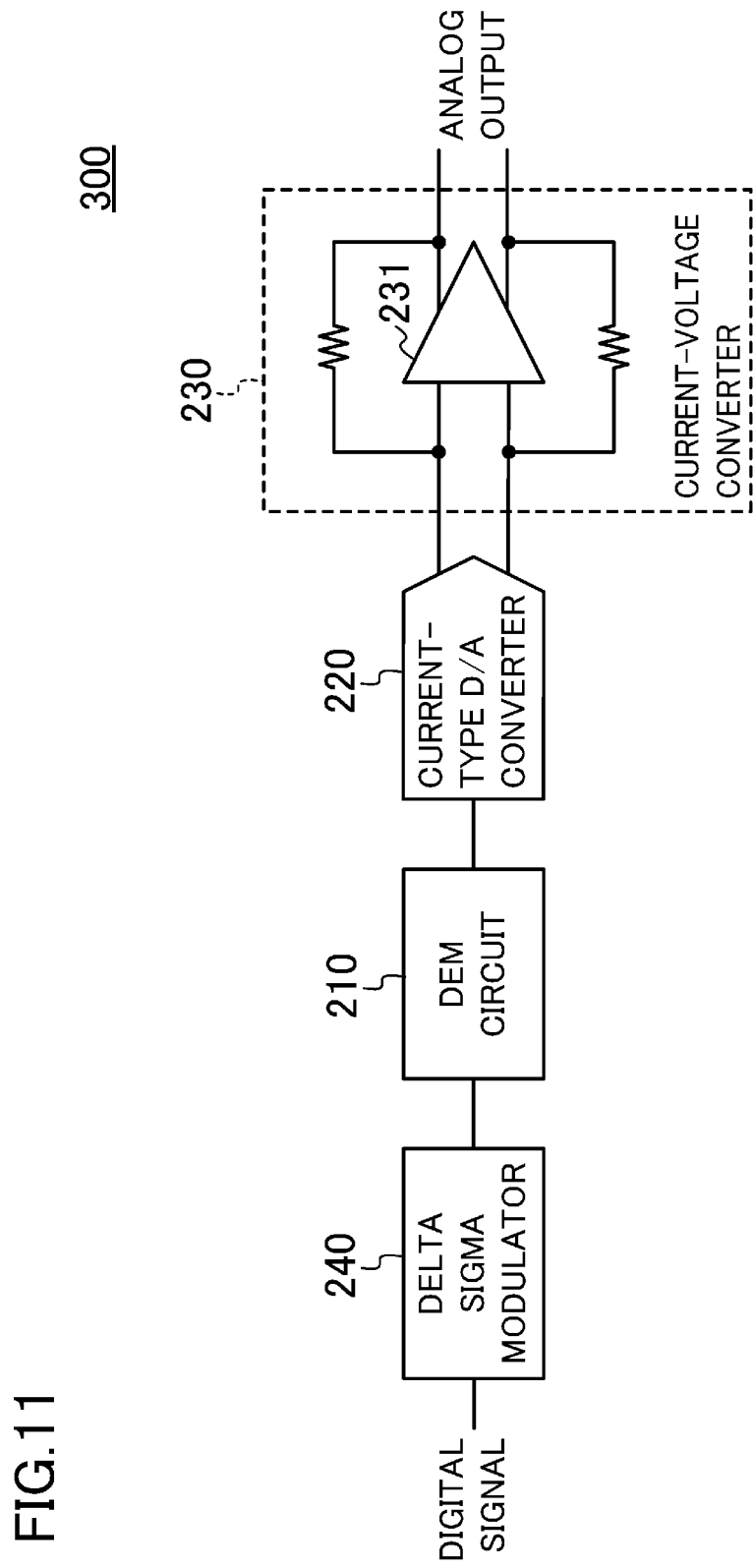
FIG. 11 is a block diagram illustrating another configuration example of the D/A converter.

As illustrated in FIG. 11, a delta-sigma modulator 240 may be provided upstream of the DEM circuit 210, thereby forming a delta sigma D/A converter 300. Also with this configuration, harmonic distortion of the delta sigma D/A converter 300 is reduced.

<Second Example of Application of DEM Circuit>

Figure 12:
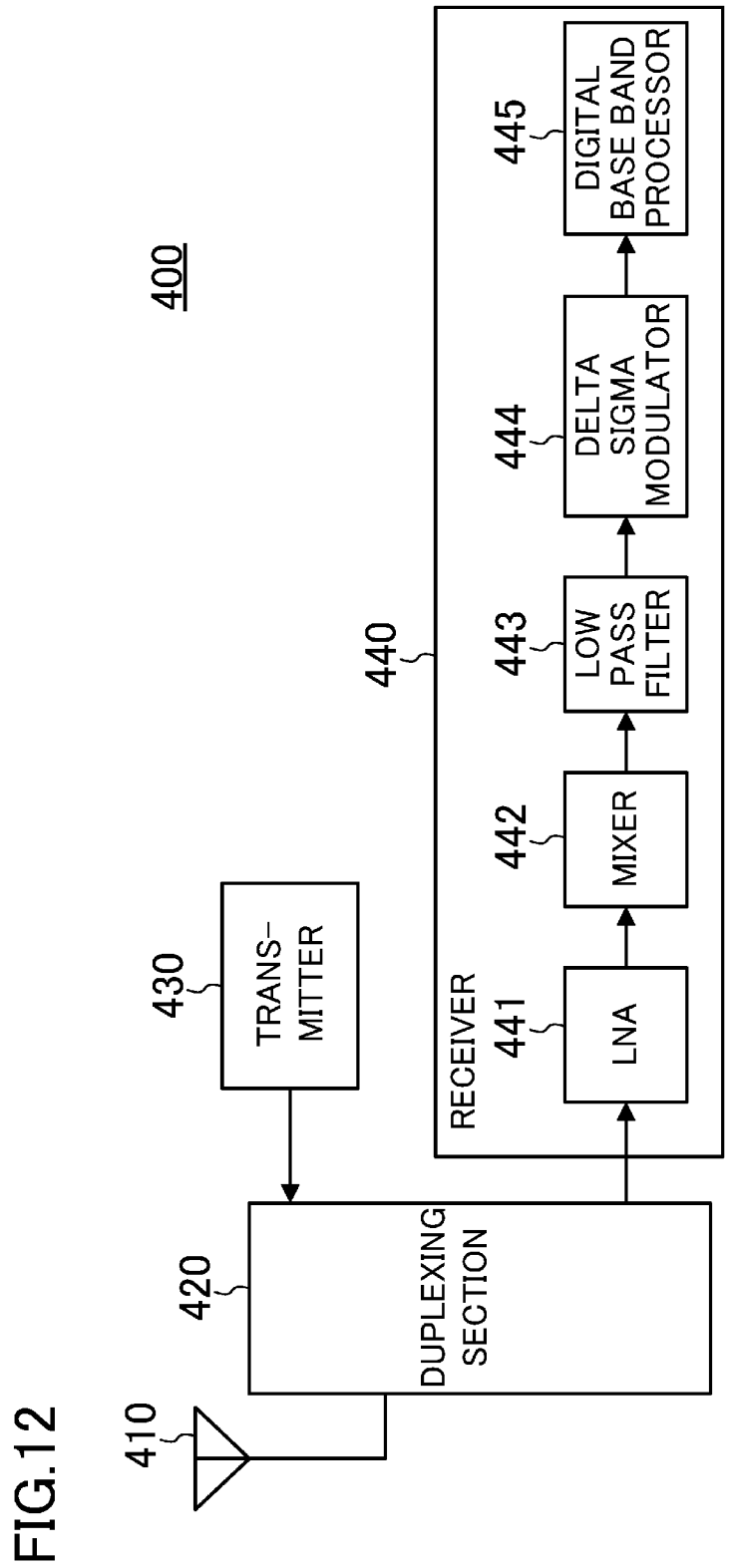
FIG. 12 is a block diagram illustrating an example configuration of a wireless communication device.
Figure 13:
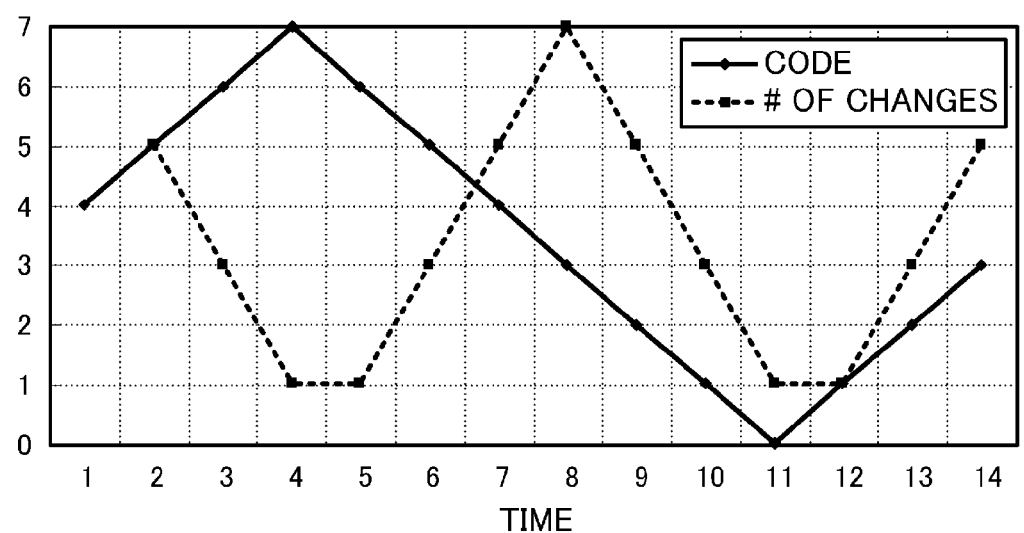
FIGS. 13A and 13B are views illustrating example operation of a conventional DEM circuit.

FIG. 12 is a block diagram illustrating an example configuration of a wireless communication device.

A wireless communication device 400 of FIG. 12 includes an antenna 410 by which a radio wave is received/transmitted, a transmitter 430 configured to perform a predetermined transmission process including a modulation process on a transmission signal, a receiver 440 configured to perform a predetermined reception process including a demodulation process on a received signal, and a duplexer 420 configured to switch between the transmission signal and the received signal.

The receiver 440 includes a low-noise amplifier (LNA) 441, a mixer 442, a low pass filter 443, and a delta-sigma modulator 444 as described in the above embodiment (e.g., the delta-sigma modulator 100 of FIG. 1), and a digital baseband processor 445.

With this configuration, a wireless communication device having low power consumption can be obtained with low costs.

In the above embodiments, the example in which a matrix switch is used as the switch 131 has been described, but the disclosure is not limited to this embodiment. For example, the switch 131 may provide a function similar to that of the matrix switch by a combination of a switch and a logic circuit or only a logic circuit.

The DEM circuit according to the present disclosure is capable of reducing harmonics and operating at a high speed, and thus is useful for electronic devices such as delta-sigma modulators, data converter, wireless communication devices, audio devices, and video devices.

What is claimed is:

1. A dynamic element matching (DEM) circuit comprising:
    a switch; and
    a switch control signal generation circuit, wherein
    the switch receives an N-bit digital input signal and shifts bit positions of the digital input signal in a circulating pattern based on a switch control signal to obtain a shifted signal, and output the shifted signal as an N-bit digital output signal, where N is an integer greater than or equal to 2,
    the switch control signal generation circuit includes a plurality of pointers,
    the bit positions of the digital input signal in the digital output signal are determined by the pointers,
    the pointers move, based on a predetermined rule, in an identical direction which is any one of a direction toward higher bit orders or a direction toward lower bit orders, and
    the switch control signal generation circuit generates the switch control signal, each time when the digital input signal is input to the switch, by using the pointers in a predetermined order.

2. The DEM circuit of claim 1, wherein
    the pointers include a first pointer and a second pointer, and
    the switch control signal generation circuit generates the switch control signal, each time when the digital input signal is input to the switch, by alternately using the first pointer or the second pointer.

3. The DEM circuit of claim 1, wherein
    the pointers include a first pointer and a second pointer, and
    the switch control signal generation circuit generates the switch control signal, each time when the digital input signal is input to the switch, by randomly selecting and using the first pointer or the second pointer.

4. The DEM circuit of claim 1, wherein the switch is a matrix switch.

5. The DEM circuit of claim 3, wherein the randomly selecting is performed by using whole or part of the digital input signal.

6. The DEM circuit of claim 2, wherein
    the switch control signal generation circuit further includes a third pointer,
    based on a rule common to the rule for the first and second pointers, the third pointer moves in a direction identical to the direction in which the first and second pointers move, and
    the switch control signal generation circuit generates the switch control signal, each time when the digital input signal is input to the switch, by sequentially using the first, second, and third pointers.

7. The DEM circuit of claim 3, wherein
    the switch control signal generation circuit further includes a third pointer,
    based on a rule common to the rule for the first and second pointers, the third pointer moves in a direction identical to the direction in which the first and second pointers move, and
    the switch control signal generation circuit generates the switch control signal, each time when the digital input signal is input to the switch, by randomly selecting and using one of positions of the first, second, and third pointer.

8. A delta-sigma modulator comprising:
    a loop filter;
    a quantizer receiving a signal output from the loop filter and convert the signal to a digital signal;
    the DEM circuit of claim 1 receiving the digital signal output from the quantizer as the digital input signal; and
    a feedback D/A converter performing D/A conversion of a digital signal output from the DEM circuit to obtain an analog signal and feedback the analog signal to an input of the loop filter.

9. A D/A converter comprising:
    the DEM circuit of claim 7;
    a current-type D/A converter performing D/A conversion of a digital output signal of the DEM circuit, and
    a current-voltage converter including an operational amplifier receiving an output signal of the current-type D/A converter.

10. The D/A converter of claim 9, further comprising:
    a delta-sigma modulator provided upstream of the DEM circuit and receiving an input signal, wherein
    the DEM circuit receives a digital output signal output from the delta-sigma modulator as the digital input signal.

11. A wireless communication device comprising:
an antenna transmitting/receiving a radio wave;
a receiver including the delta-sigma modulator of claim 8 and performing a reception process of a received signal from the antenna;
a transmitter performing a transmission process of a transmission signal; and
a duplexer disposed between the receiver and the antenna and between the transmitter and the antenna, and performing switching between supply of the received signal from the antenna to the receiver and supply of the transmission signal from the transmitter to the antenna.

* * * * *